(12) United States Patent
Peters

(10) Patent No.: US 6,771,682 B2
(45) Date of Patent: Aug. 3, 2004

(54) ELECTRICAL ISOLATION OF OPTICAL COMPONENTS IN PHOTONIC INTEGRATED CIRCUITS (PICS)

(75) Inventor: Frank H. Peters, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 10/283,476

(22) Filed: Oct. 30, 2002

(65) Prior Publication Data

US 2004/0028105 A1 Feb. 12, 2004

Related U.S. Application Data

(60) Provisional application No. 60/402,801, filed on Aug. 12, 2002.

(51) Int. Cl.[7] .................................................. H01S 5/00
(52) U.S. Cl. ........................................... 372/50; 372/45
(58) Field of Search ..................................... 372/45, 50

(56) References Cited

U.S. PATENT DOCUMENTS

| | | | | |
|---|---|---|---|---|
| 5,642,371 A | * | 6/1997 | Tohyama et al. | ............. 372/45 |
| 5,764,670 A | * | 6/1998 | Ouchi | ......................... 372/45 |
| 5,909,294 A | * | 6/1999 | Doerr et al. | ................. 359/114 |
| 6,081,361 A | * | 6/2000 | Adams et al. | ............... 359/188 |
| 6,148,017 A | | 11/2000 | Borchert et al. | .............. 372/50 |
| 6,236,794 B1 | | 5/2001 | Mallecot et al. | ............ 385/132 |
| 6,414,298 B1 | * | 7/2002 | Nakajima | ............... 250/214 R |
| 6,452,220 B1 | * | 9/2002 | Morse et al. | ................ 257/183 |

* cited by examiner

*Primary Examiner*—Paul Ip
*Assistant Examiner*—Hung T Vy
(74) *Attorney, Agent, or Firm*—W. Douglas Carothers, Jr.

(57) ABSTRACT

Electrical isolation regions are formed between adjacently disposed electro-optical components integrated in a monolithic semiconductor photonic chip, such as an EML or PIC chip. A bias, $V_C$, is applied to the isolation region so that any parasitical current path developed between adjacent active or passive optical components, now separated by an isolation region, is established through the electrical isolation region and clamped to the bias, $V_C$. The applied bias, $V_C$, may be a positive bias, a negative bias, or a zero or a ground bias. The electrical isolation regions are formed by spatial current blocking regions formed at adjacent sides of the electrical isolations region transverse to a direction of light propagation through the optical components, or between the electrical isolation regions and adjacent optical components. The spatial current blocking regions may be comprised of a pair of spatially disposed trenches or ion implanted regions or high resistance implanted regions.

56 Claims, 7 Drawing Sheets

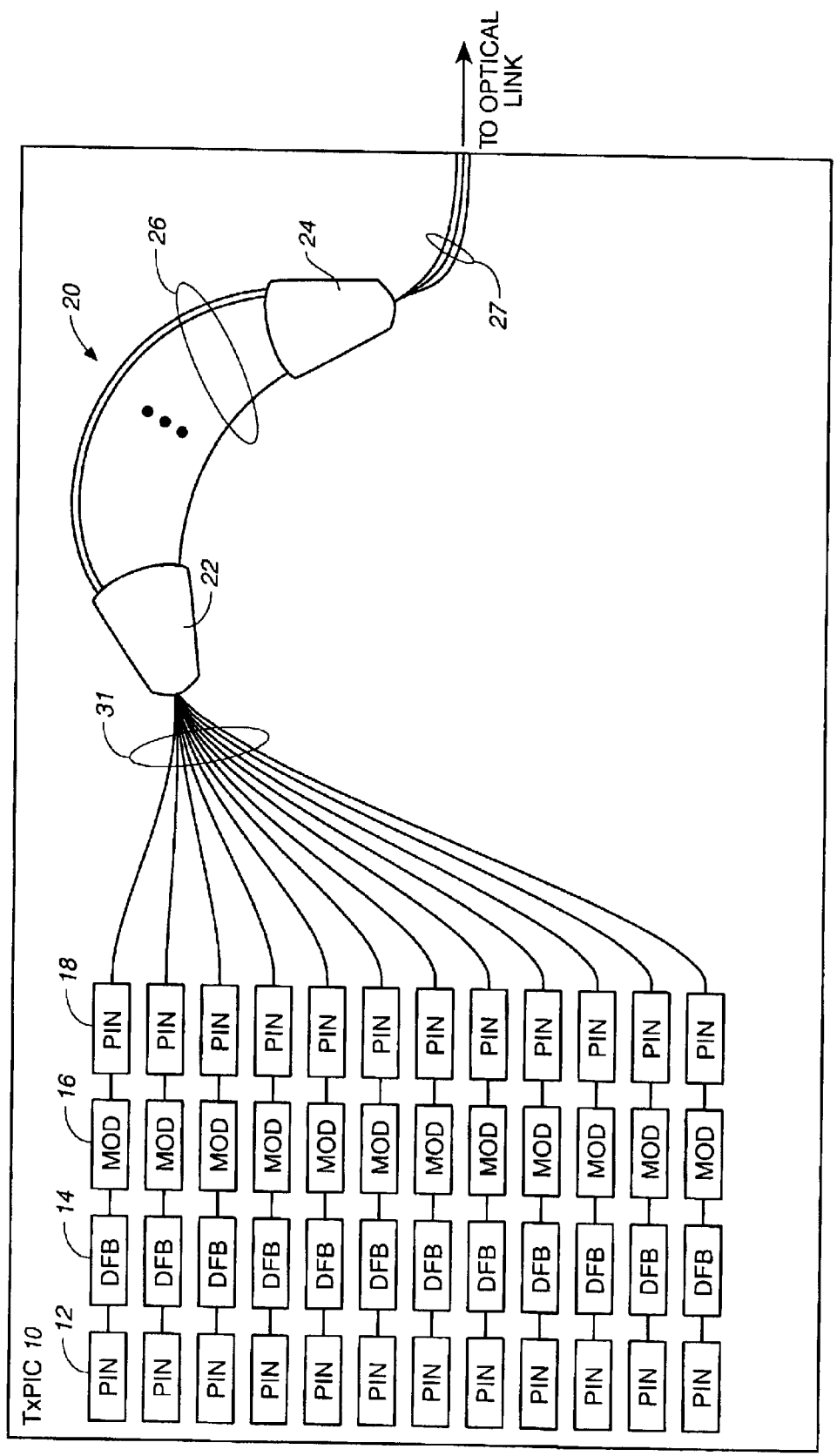
FIG._1

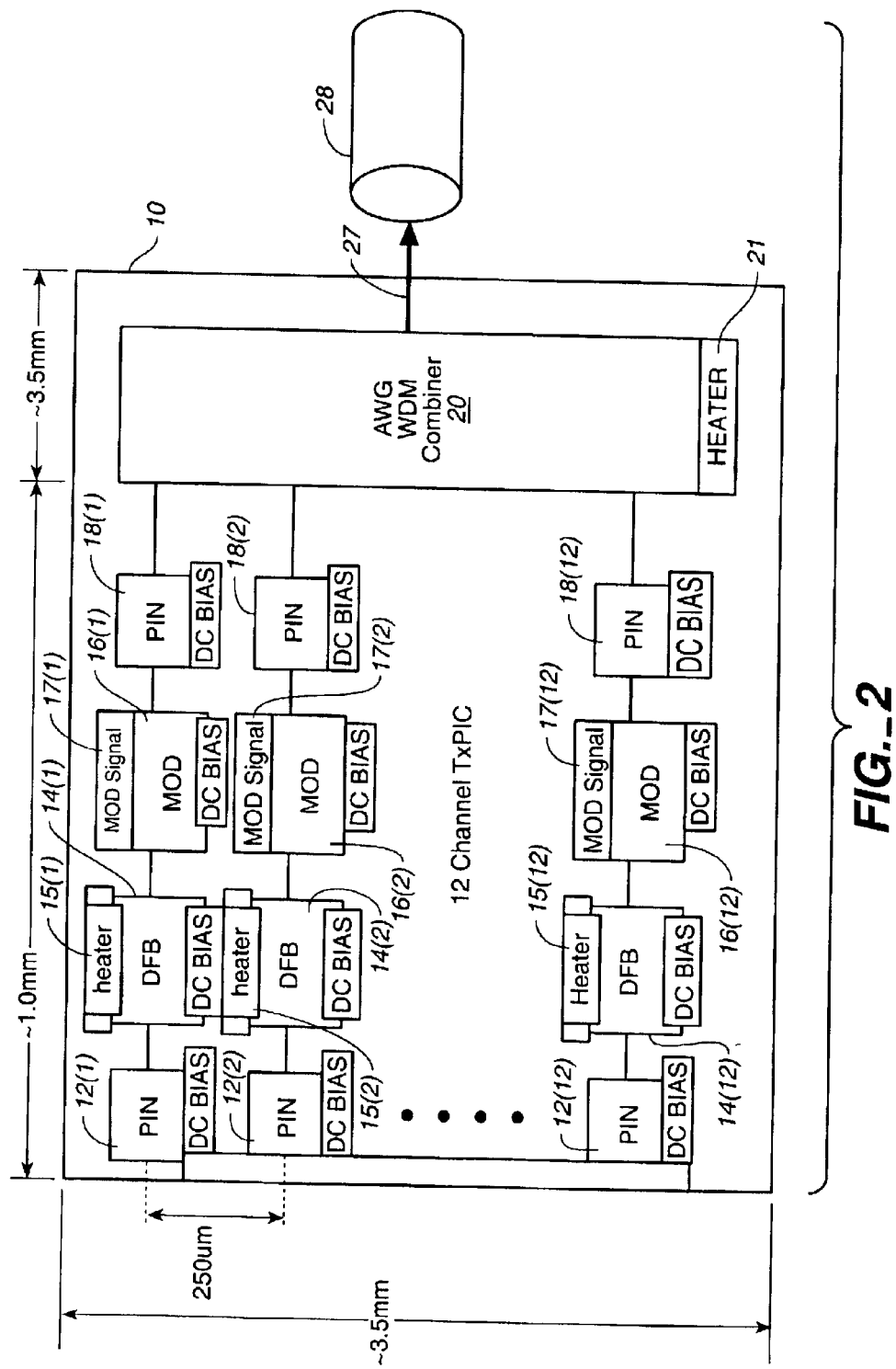
FIG._2

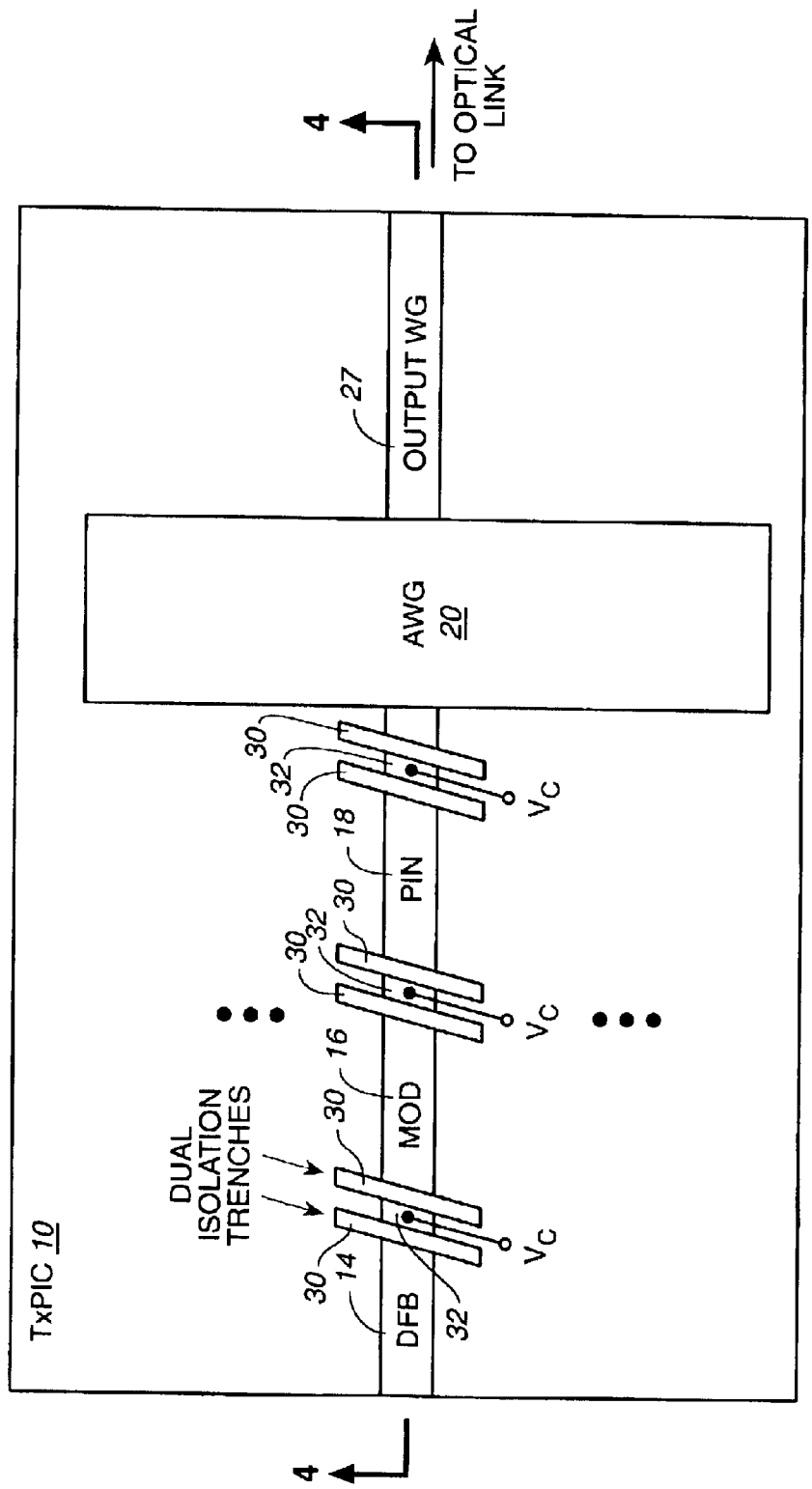
FIG._3

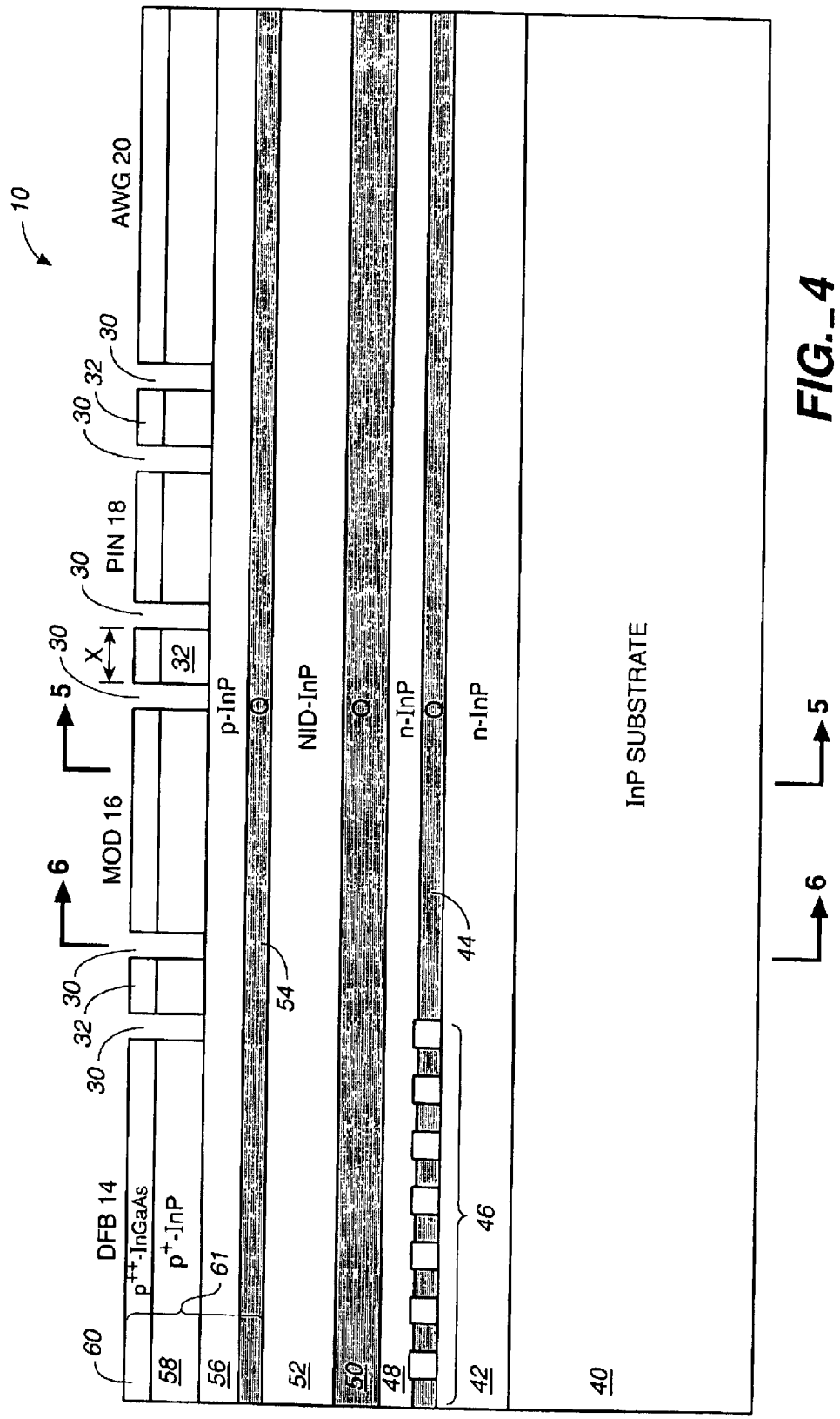
FIG._4

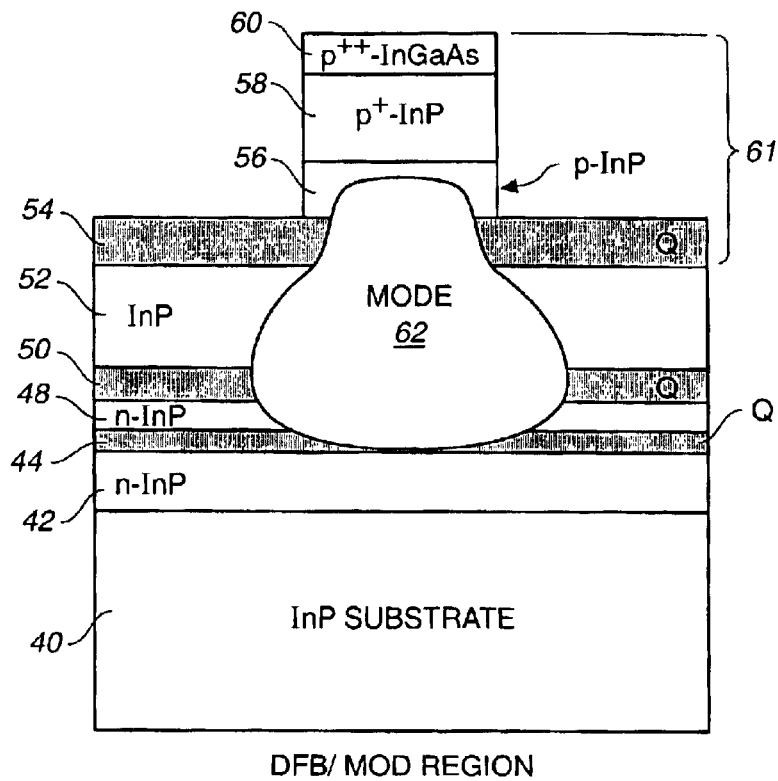
DFB/ MOD REGION
FIG._5
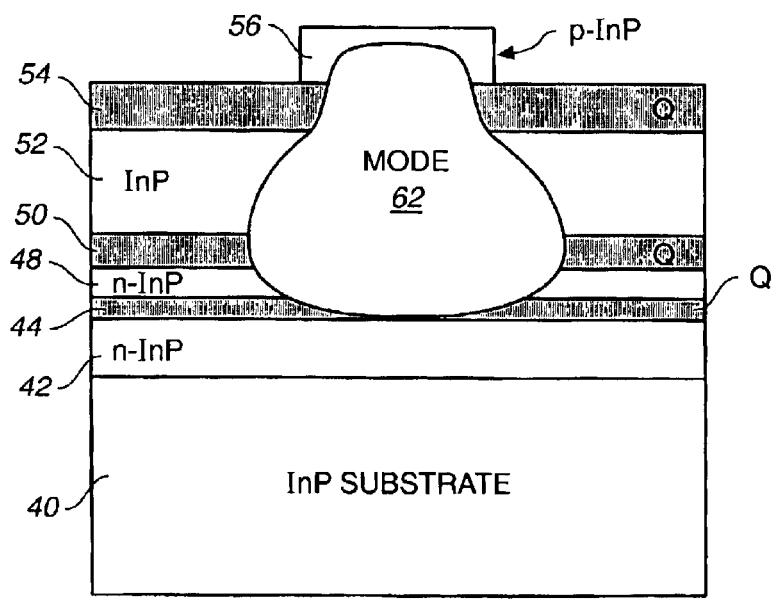
ETCHED ISOLATION REGION
FIG._6

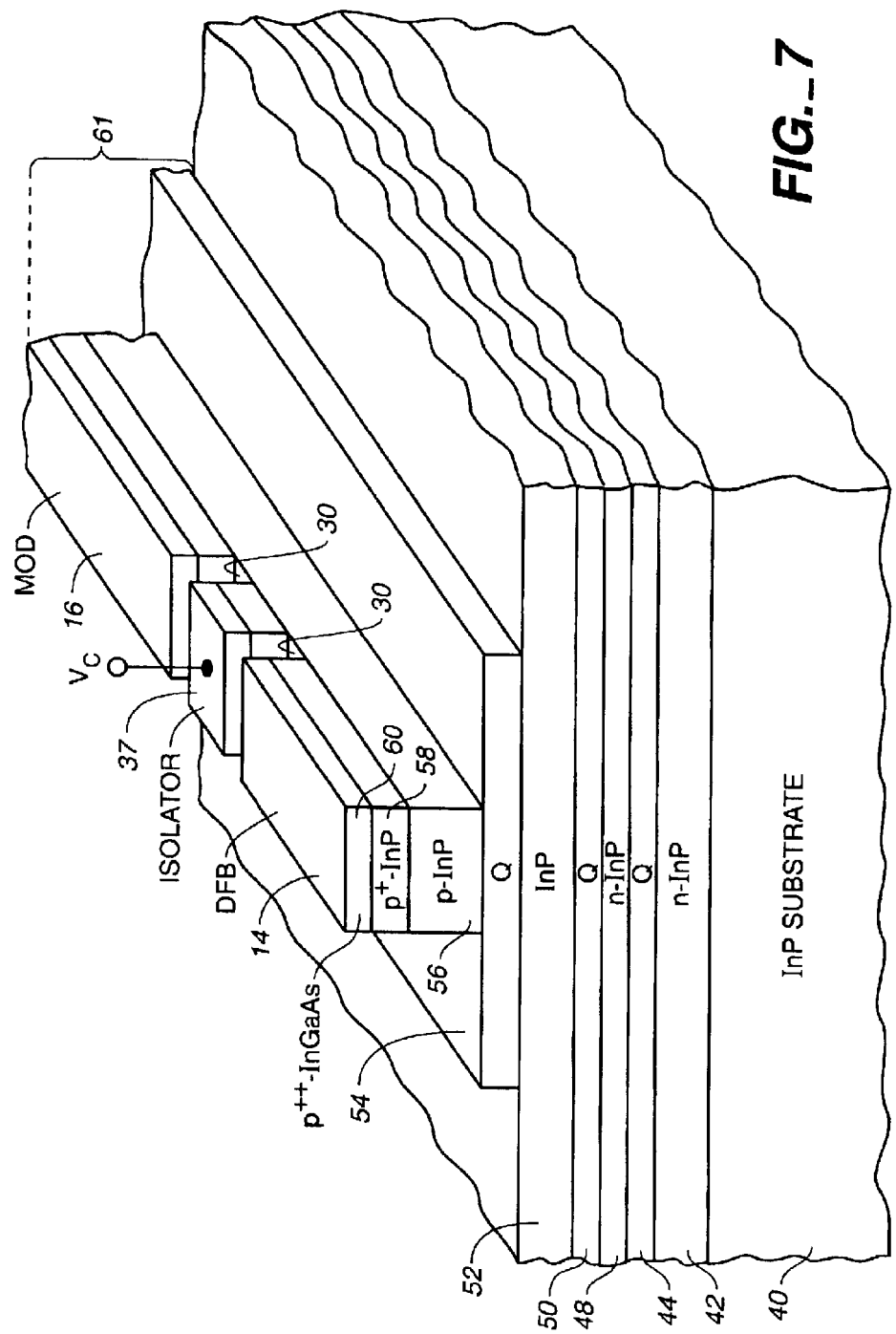
FIG._7

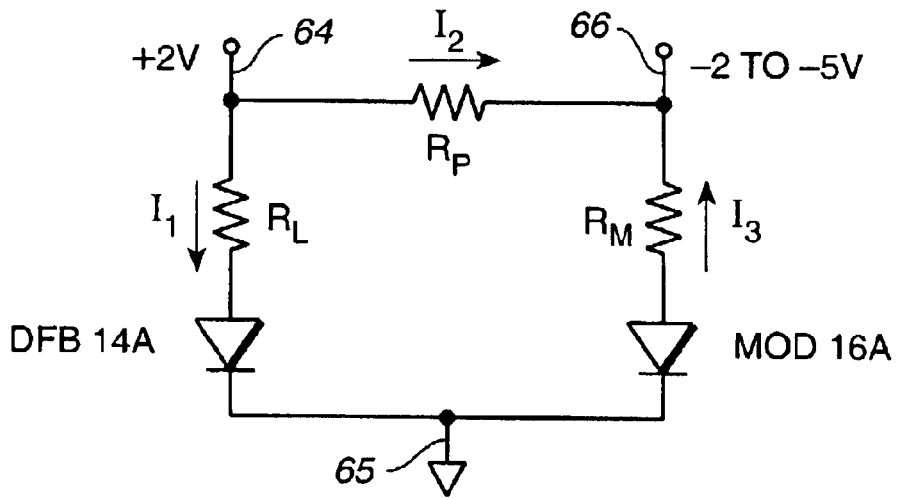
FIG._8
*(PRIOR ART)*
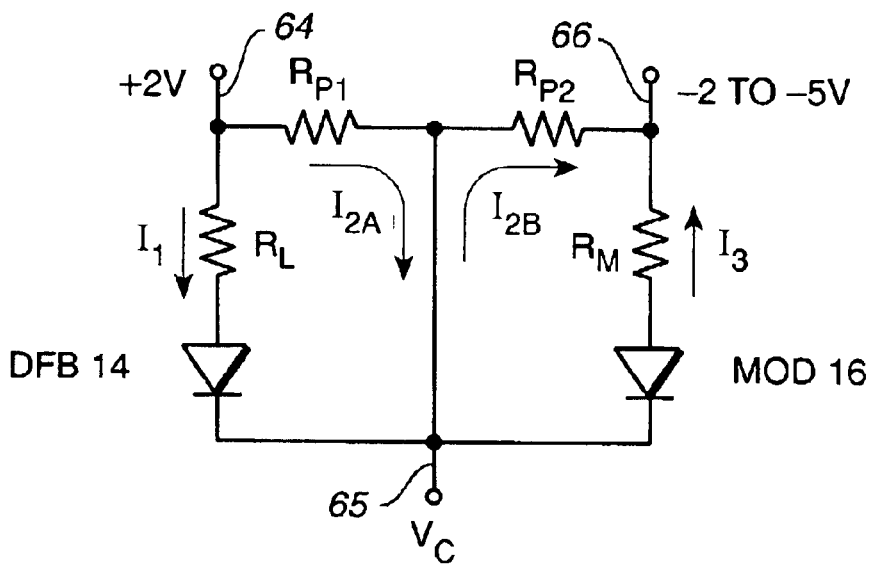
FIG._9

ELECTRICAL ISOLATION OF OPTICAL COMPONENTS IN PHOTONIC INTEGRATED CIRCUITS (PICS)

REFERENCE TO RELATED APPLICATION

This application claims priority to U.S. provisional application, Serial No. 60/402,801, filed Aug. 12, 2002, which application is incorporated herein by reference.

BACKGROUND OF THE INVENTION

1. Field of the Invention

This invention relates generally to photonic integrated circuits (PICs), including electro-absorption modulators/lasers (EMLs), and more particularly to electrical isolation of electro-optical components in such circuits.

2. Description of the Related Art

In photonic integrated circuits or PICs, two or more active or electro-optical components as well as possibly at least one passive optical component are generally integrated on a single semiconductor or other type of chip. A well known example of this kind of PIC chip is an EML (Electro-absorption Modulator/Laser) where, for example, a distributed feedback (DFB) laser is integrated with an electro-optical modulator such as illustrated, for example, in U.S. Pat. No. 6,148,017, employing the InGaAsP/InP regime. There are many such examples of EMLs in the art and this just one recent example of this type of device. In order that there is no electrical interference between the operation of these integrated electro-optical components, an electrical isolation region (which is shown at reference number 5 in the above mentioned patent), which is usually an isolation trench, is generally deployed between such optical components. The trench usually extends down into the bulk of the PIC chip as far as the upper confinement layer, for example, above the active region of the PIC chip. However, it is desirable not to extend such a trench too far into the chip so as to perturb the optical mode propagating in the active region of the device as well as cause significant backward reflections of the optical mode since such a trench can function as a partial mirror to the propagating mode.

These types of EMLs suffer from lack of good electrical isolation between the optical modulator and the DFB laser because the trench is still not deep enough to provide good avoidance of electrical interference, particularly in the separation of the operation of the DFB laser from the electrical modulation of the optical modulator. In particular, parasitic current paths still exist between these electro-optical components. For example, in EMLs, a parasitic path will exist below the isolation trench between the DFB laser and the electro-optical modulator such that the DFB laser will experience fluctuation changes in its drive current via the fluctuations of the parasitic current established between the laser and modulator. This modulated parasitic current perturbs the operation of the DFB laser. As indicated above, generally the isolation trench cannot be made deeper into the PIC chip in an attempt to further electrically isolate the DFB laser from the optical modulator without affecting the properties of the propagating optical mode.

OBJECTS OF THE INVENTION

It an object of the present invention to overcome the aforementioned problems.

It is a further object of this invention to provide for electrical isolation particularly between electro-optical components in a PIC, such as an EML without affecting the propagating optical mode in the PIC.

SUMMARY OF THE INVENTION

According to this invention, an electrical isolation region is formed between adjacently disposed electro-optical components integrated in a monolithic semiconductor photonic chip, such as an EML or PIC chip, wherein a bias, $V_C$, is applied to the isolation region so that any parasitic current path developed between adjacently disposed electro-optical components, now separated by the isolation region, is established through the electrical isolation region and clamped to the bias, $V_C$. The applied bias, $V_C$, may be a positive bias, a negative bias, or a zero or a ground bias. While EMLs have been exemplified herein, other electro-optical devices integrated on a semiconductor chip may also be benefited by the isolation region utilized in this invention, such as, for example, a photodetector (PIN) photodiode or avalanche photodiode (APD)), a semiconductor optical amplifier (SOA) or a gain clamped semiconductor amplifier (GCSOA), also referred to as a semiconductor laser amplifier, as well as a semiconductor electro-absorption modulator (EAM), Mach-Zehnder modulator (MZM), DFB laser or DBR laser.

In a particular embodiment of this invention, the electrical isolation regions are formed by spatial current blocking regions formed at adjacent sides of the electrical isolations region transverse to a direction of light propagation through electro-optic components and/or optical passive components formed in the PIC chip, or said another way, between each electrical isolation region and an adjacent optical component which all integrated into the PIC chip. The spatial current blocking regions sandwiching the electrical isolation region is coupled to bias, $V_C$, for capturing any parasitic current flow between the electro-optic components or optical passive components in the PIC chip. The preferred embodiment for spatial current blocking regions herein is spatially disposed trenches between which the electrical, biased isolation region of this invention is achieved. However, it is within the scope of this invention to provide such isolation regions utilizing means other than trenches, such as by forming insulating regions via doping, e.g., Fe doping, or via ion implant, e.g., $H^+$ implantation, or other processes or structures that would form such an electrical isolation region.

While general mention here is made of active or electro-optical components and their electrical isolation from one another, it should be understood that the isolation regions of this invention may also be utilized between active and passive optical components formed in a PIC chip, such as between PIN photodetectors or electro-optical modulators and an optical combiner (multiplexer), such as an arrayed waveguide grating (AWG), where the refractive index of the latter can be affected by induced parasitic current paths established from such active devices to the passive device changing slightly its waveguide properties due a to slight change in refractive index in at least a portion of the passive device due to such parasitic current flow.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is a schematic plan view of an example of a photonic integrated circuit (PIC).

FIG. 2 is a schematic view of a more detail of the PIC shown in FIG. 1.

FIG. 3 is schematic plan view of a PIC of the type shown in FIG. 1 utilizing the electrical isolation regions of this invention between adjacently disposed optical components integrated in the PIC chip.

FIG. 4 is a schematic cross-sectional view along the line 4—4 of FIG. 3.

FIG. 5 is a schematic cross-sectional view taken along either of the lines 5—5 of FIG. 4.

FIG. 6 is a schematic cross-sectional view taken along the line 6—6 of FIG. 4.

FIG. 7 is a perspective view of a portion of the PIC shown in FIGS. 3–6.

FIG. 8 is an electrical circuit representation of an EML as known in the art having at least one parasitic current path.

FIG. 9 is an electrical circuit representation of an EML illustrating a parasitic current path to an electrical isolation region of this invention rendering such a current path negligible relative to the functionality of adjacently disposed optical components integrated in the same chip.

DETAILED DESCRIPTION OF THE INVENTION

Reference is now made to the details of an embodiment of a type of photonic integrated circuit (PIC) that may be utilized in connection with this invention. It should be understood that while a multi-component PIC devices are illustrated in connection with this invention, any optical device that includes adjacently integrated optical components where at least one of the components is an active device, i.e., an electro-optical operated component, may utilize this invention.

Referring now to FIG. 1, the illustrated PIC device comprises a transmitter photonic integrated circuit or TxPIC 10. The architecture of TxPIC 10 is further detailed as to structure, operation and functionality in previously filed patent application Ser. Nos. 10/267,331; 10/267,330; 10/267,346; and 10/267,304, all filed Oct. 8, 2002, which applications are all incorporated herein by reference. While the first three referenced applications all deal with TxPICs, the last mentioned application Ser. No. 10/267,304, deals with receiver photonic integrated circuits (RxPICs) to which this invention can also be applied, for example, relative to electrical isolation of the photodetectors formed in a RxPIC chip from other active (e.g., SOAs) or passive (e.g. AWG) components integrated in the same PIC chip.

In FIG. 1, TxPIC 10 comprises an InP-based semiconductor chip which includes integrated optical and electro-optic components formed as integrated electro-optic circuit. Chip 10 comprises a plurality of aligned DFB lasers 14 each having a different operating wavelength within a standardized wavelength grid, such as the ITU grid. Laser 14 can also be a distributed feedback (DFB) laser. There are twelve such lasers and signal channels shown in FIG. 1. However, there may be any number of such channels on-chip, for example, ranging from 4 to 40 channels. Some of these signal channels may be redundant channels for use in place of inoperative lasers or modulators or EMLs. These DFB lasers 14 are wavelength stabilized as set forth in the above identified provisional applications. Each of the twelve channels in chip 10 also includes an optical modulator 16 to modulate the light output of a respective CW operated DFB laser 14. Chip 10 may also include an array of PIN photodiodes 12 to monitor the power and wavelength of each DFB laser 14. Also, an array of PIN photodiodes 18, respectively following each modulator 16, may be utilized to monitor the power, chirp and extinsion ratio of modulator 16. These photodetectors 12 and 18 are optional in TxPIC 10 so that TxPIC 10 may be, at a minimum, an array of DFB lasers 14 and modulators 16 and an optical combiner 20 of some type. The modulators 16 may be, for example, electro-absorption modulators (EAMs) or Mach-Zehnder modulators (MZMs). The outputs 31 from PIN photodetectors 18 are optical waveguides formed in chip 10, and are formed in fan arrangement from PINs 18 to the input of an optical combiner 20 which is shown here as an arrayed waveguide grating (AWG) comprising an input slab 22, a plurality of grating arms 26 of predetermined increasing length and an output slab 24 as known in the art. Optical combiner 20 may also be echelle grating, a multi-mode interference coupler, a star type coupler, or a slab or free space coupler. AWG 20 combines the modulated signals on waveguides 31 into a WDM signal that is provided on one of the vernier output waveguides 27 formed in chip 10 from output slab 24 for taking the multiplexed channel signals off-chip. The waveguide 27 having the best signal spectrum from AWG 20 is chosen as the output for launching the WDM signal onto an optical fiber.

FIG. 2 shows additional details of TxPIC chip 10 of FIG. 1. To be noted is that chip 10 has twelve signal channels and has a chip size that is fairly small comprising, for example, 3.5 mm by 4.5 mm. DFB lasers 14(1) ... 14(12) are set on center-to-center spacing, for example, of about 250 μm. Also shown is the DC biasing for laser monitoring PIN photodiodes 12(1) ... 12(N), DFB lasers 14(1) ... 14(12), optical modulators 16(1) ... 16(12) and modulator monitoring PIN photodiodes 18(1) ... 18(12). On-chip heaters 15(1) ... 15(12), which may be strip heaters, for example, are provided for each laser and independently operated to maintain the peak operating wavelength of each laser to its proscribed wavelength on the standardized grid. Also, a heater 21 may be provided to control the wavelength grid of AWG 20 in conjunction with the control of the individual operating wavelength of DFB lasers 14 via heaters 15(1) ... 15(12). This wavelength grid control is explained in further detail in the above referenced provisional applications. Lastly, each of the modulators 16 has a coaxial or coplanar electrode arrangement 17(1) ... 17(12) to provide to each modulator 16 with an electrically modulated signal for modulating the cw light provided from DFB lasers 14, i.e., to accomplish EO signal conversion, signal multiplexing at AWG 20 and launching the multiplexed signal via output waveguide 27 onto optical fiber link 28.

Reference is now made to FIG. 3 illustrating a plan view of TxPIC 10 utilizing isolation regions 32 of this invention. PIC chip 10 in FIG. 3 is the same as that shown in FIGS. 1 and 2 except that only one optical signal channel is shown for purposes of simplicity of explanation. The electrical isolation regions 32 are formed by spatial current blocking regions 30 formed at adjacent sides of electrical isolations regions 32 transverse to a direction of light propagation through the optical components, or between the electrical isolation regions and adjacent optical components. Spatial current blocking regions 30 may be comprised of a pair of: (1) spatially disposed trenches or (2) ion implanted regions or (3) high resistance implanted regions. In the preferred embodiment, regions 32 are shown as a pair of spatially disposed trenches 30.

As shown in FIGS. 4–7, TxPIC 10 comprises an InP substrate 40, either semiconductive (n-doped) or insulating (Fe-doped), upon which is epitaxially ("epi") deposited, employing MOCVD, an InP buffer layer (not shown) followed by a n-doped InP layer 42 and a quaternary grating layer 44 of AlInGaAs or InGaAsP. These quaternary layers are referred to herein collectively as a "Q" layer or layers. A selective etch is then performed to form grating region 46 in the DFB portion of PIC 10. After formation of grating 46, epi growth is continued with the deposit of n-InP layer 48, Q active/waveguide region 52 (which generally comprises multiple quantum wells and barriers), nonintentionally doped (NID) InP layer 52, Q stop etch layer 54, cladding layer 56 of p-InP, $p^+$-InP layer 58 and contact layer $p^{++}$-InGaAs. As shown best in FIGS. 5 and 6, a selective etch is performed longitudinal between adjacent optical pathways constituting signal channels, such as the twelve signal channels illustrated in PIC 10 of FIG. 2, where each channel comprises a DFB laser 14, a MOD 16, PIN 18 and an optical combiner 20, such as an AWG, star or slab coupler. The selective etch is performed down to the stop etch Q layer 54. It is within the scope of this description that other stop etch layers, other than a Q layer, may be utilized to perform the stop etch function. For example, the stop etch layer may also be NID AlInAs, or InAlGaAsP.

As illustrated in FIGS. 5 and 6, the resulting etch forms a ridge waveguide structure 61 provides sufficient mode guiding while permitting expansion of the propagating mode 62 into ridge waveguide 61 which correspondingly permits an increase in the light intensity of the mode. In other words, the propagating mode is less confined in the waveguide structure which includes Q layers 44 and 50. This is important from the standpoint of having sufficient on-chip power in the modulated channel signals that are optically combined and presented at the output of the InP chip 10 without any requirement of on-chip amplification, such as via integrated, on-chip semiconductor optical amplifiers (SOAs) which require the supply of additional power to TxPIC 10 for their operation. This would significantly impact the power budget of chip 10. Also, alternatively, the ridge waveguide may include a Q layer (not shown) which is formed within the ridge waveguide to provide a rib-loaded waveguide which permits the propagating mode to expand even more into the ridge waveguide thereby permitting a further increase in optical mode intensity.

Returning now to FIGS. 4 and 7, in order to reduce or otherwise eliminate parasitic or leakage currents that naturally forms between adjacent optical components, particularly with respect to active or electro-optical components, such as DFB lasers 14, MODs or EAMs 16 and PINs 18, isolation regions 32 are formed between these optical components 14, 16, 18 and 20. As an example, these isolators or isolation regions 32 may be about X=20 $\mu$m in length, although they may also be smaller or larger in size. The preferred approach is to render them as small as possible in length and still perform the function of clamping parasitic or leakage currents that developed between adjacent optical components to a bias voltage point or ground. The reason is to conserve as much as possible room or real estate on PIC chip 10. Isolation regions 32 thus perform two important functions. First, they electrically isolate adjacent optical components by clamping parasitic or leakage flows to a voltage or ground. Second, they help to render the resistance in the PIC structural layers sufficiently large so that these leakage currents are at least reduced to the microampere range. For example, layers 52, 54 and 56 may be ion implanted in areas below isolation regions 32 to increase resistivity.

Isolation regions 32 are formed by forming spatial current blocking regions 30 via performing a selective etch to provide dual isolation trenches 30 between which is defined isolation region 32, as shown in FIGS. 3 and 4. These trenches are formed at an angle, i.e., transversely, relative the longitudinal axis of the light propagation path through components 14, 16 and 18, such as, for example, angled at 7° from a line perpendicular to the longitudinal axis of light propagation, in order that any reflections of the propagating optical mode are reflected out of the light propagation path. Also, as best seen in FIGS. 4 and 7, the depth of trenches 30 is through layers 58 and 60 so as not made too deep so as to have a significant effect on the propagation of the mode 62. Also, as best seen in FIG. 7, the selective etch to form the ridge waveguide extends through layers 56, 58 and 60 to etch stop layer 54. However, portions of the etch stop layer between adjacent light propagation paths via the ridge waveguides may also be removed as shown in FIG. 7, which renders layer 54 as part of the ridge waveguide 61.

In order to provide some passivation, trenches 30 as well as the surface of PIC chip 10 may be covered with a layer of dielectric material, such as BCB or polyimide. As previously indicated, beside the deployment of etched trenches 30, spatial current blocking regions 30, comprising etched trenches 30, can be made of high resistance by Fe doping into unetched spatial current blocking regions 30 or performing an ion implant into unetched spatial current blocking regions 30 such as via an $H^+$ implant.

It should be understood that a balance is achieved between the parameters of the height of the ridge waveguide 61, the depth of the trenches 30 and the control of bulk resistance in regions below trenches 30. It is desirable, for example, to increase the height of ridge waveguide 61 but not so high that the propagating mode experiences significant reflections due to the walls of trenches 30. Thus, the trenches 30 should not be so deep as to significantly affect the propagating mode but it is also desirable to make trenches 30 sufficiently deep to better electrically isolate adjacent optical components where the propagating mode experiences only negligible optical reflections. One additional parameter in this balance of parameters is to also enhance the resistive nature of the of areas below isolation regions 32, such as, for example, p-InP layer 56 and/or Q layer 54 where the doping concentration in layer 56, in particular, is decreased or an ion implant is made into the areas of layers 54 and 56 below isolation regions 32 during the growth process to render the bulk resistance of these areas higher, as previously alluded to above concerning the two functions pertaining to isolation regions 32.

Reference is now made to FIGS. 8 and 9 to explain how, from an electrical point of view, the isolation regions 32 perform their functions. It should be realized that voltage biases shown in these figures is merely representative of one set of conditions as other such voltage biases, either higher or lower, may be desired or necessary depending upon the operating parameters of the particular electro-optical components and the bulk resistance of the PIC structure. As shown in the case of FIG. 8 where there is a single isolation trench, as discussed previously in connection with the prior art, or there is no isolation, there is established a current path to operate DFB laser 14A with current flow, $I_1$, from a positive bias point 64 to reference or ground 65 ($R_L$ represents the resistance in the path including of DFB 14A), and a current path to operate MOD 16A with a current flow, $I_3$, from reference or ground 65 to a negative bias point 66 ($R_M$ represents the resistance in the path including of MOD 16A). Also, as an example, a parasitic path is established from positive bias point 64 to negative bias point 66 with a parasitic current flow, $I_2$, in the semiconductor bulk between DFB laser 14A and MOD 16A which is represented by a bulk resistance of $R_P$. As MOD 16A is modulated via current, $I_3$, the level of current flow, $I_2$, will correspondingly fluctuate to bias point 66. Also, correspondingly, the current flow, $I_1$, will vary in accordance with changes in current flow, $I_2$. Changes in the current flow to DFB laser 14A is not desirable because changes in the applied current create corresponding changes in the desired or predetermined operational wavelength of the laser via refractive index changes in the laser due to current changes across the diode. However, in the case of the deployment of the isolation regions 32 of the present invention, as shown in FIG. 9, the path for parasitic current flow, $I_2$, is changed and divided into two separate paths such that the parasitic current flow, $I_{2A}$, relative to DFB 14, is from positive bias point 64 to reference or ground 65, via the PIC bulk resistance $R_{P1}$, while the parasitic current, $I_{2B}$, relative to MOD 16, is from reference or ground 65 to negative bias point 66, via the PIC bulk resistance $R_{P2}$. The modulated current will also correspondingly cause reflection of parasitic current, $I_{2B}$. To be noted is that parasitic current flow, $I_{2A}$, from DFB laser 14 since this current is clamped to $V_C$, will not vary, and the fluctuation of current flow, $I_{2B}$, will have negligible effect on the desired steady state (CW) condition of current flow, $I_1$. Also, the bulk resistances, $R_{P1}$ and $R_{P2}$, can also be designed to enhance their resistance levels, as previously discussed, so that current flows $I_{2A}$ and $I_{2B}$ are at least reduced to the microampere range.

While the invention has been described in conjunction with several specific embodiments, it is evident to those skilled in the art that many further alternatives, modifications and variations will be apparent in light of the foregoing description. As previously indicated, for example, this invention may be applied to any PIC chip or associated optical component including for example, EMLs, RxPIC chips or any other chip that contains optical or electro-optical adjacently disposed components or elements. In connection with components such as photodetectors that follow EAMs on a PIC, it should be noted that are instances that these photodetecting elements may also, themselves, be modulated for purposes of tagging or otherwise identifying the respective outputs of the several DFB lasers 14 as well as performing a monitoring function for the electro-optical characteristics of MODs 16. In such cases, the electrical isolation of fluctuating parasitic currents from either the EAMs or the photodetector elements due to their modulation can be accomplished by the use of clamping isolation regions 32. Thus, the invention described herein is intended to embrace all such alternatives, modifications, applications and variations as may fall within the spirit and scope of the appended claims.

What is claimed is:

1. A photonic integrated circuit (PIC) comprising:
   a semiconductor laser and an electro-optic semiconductor modulator integrated on a substrate where said laser and modulator are aligned in and serially along an optical waveguide path, also formed on said substrate, aid optical waveguide path substantially parallel with a planar extent of said substrate;
   an electrical isolation region formed into said semiconductor bulk between said laser and said modulator; said electrical isolation region formed by a pair of spaced current blocking regions extending into said semiconductor bulk from an exposed surface of said electrical isolation region to a depth of a parasitic current, $I_2$, established in a semiconductor bulk between said laser and said modulator, said spaced current blocking regions establishing an electrical path therebetween and providing electrical coupling between said parasitic current, $I_2$, at one end of said electrical path and an electrode formed at the other end of said electrical path at said exposed surface of said electrical isolation region; and wherein:
   said laser having a first applied bias current, $I_1$, applied thereto as steady state condition, said modulator having a second applied bias current, $I_3$, different from said first applied bias current, $I_1$, and applied thereto as modulated variations in accordance with an electrical modulated signal applied to said modulator, the first and second applied bias currents creating said parasitic current, $I_2$, in said semiconductor bulk region where said parasitic current, $I_2$, is substantially aligned in parallel relative to said optical waveguide path, said second applied bias current, $I_3$, causing modulated variations of said parasitic current, $I_2$, which, in turn, causes undesirable modulated variations of said firs applied bias current, $I_1$, through said laser so that said laser is no longer operating in said steady state condition; and
   a bias applied to said electrode to divert said parasitic current, $I_2$, through said electrical path to said applied bias such that there results divided currents, $I_{2A}$ and $I_{2B}$, established, respectively, between said laser and said applied bias and between said applied bias and said modulator so that the undesired modulated variations affecting said first applied bias current, $I_1$, to said laser are substantially eliminated.

2. The photonic integrated circuit (PIC) of claim 1 wherein the applied bias to said isolation region is positive negative or zero.

3. The photonic integrated circuit (PIC) of claim 2 wherein said applied bias is held at a constant value.

4. The photonic integrated circuit (PIC) of claim 1 wherein said spaced current blocking regions are a pair of spatially disposed trenches or ion implanted regions or high resistance implanted regions.

5. The photonic integrated circuit (PIC) of claim 1 further comprising a photodetector that is position in said optical waveguide path after said modulator and having a further bias applied thereto;
   electrical activation of both of aid modulator and photodetector creating a further parasitic current between them substantially aligned relative to said optical waveguide path, said second applied bias current, $I_3$, causing modulation variations of said further parasitic current, which, in turn, causes undesirable modulation variations of said further parasitic current so that said further applied bias does no operate in a steady state condition;
   a further electrical isolation re on formed between said modulator and said photodetector, said further region formed by a pair of further current blocking regions extending into said circuit between said modulator and said photodetector in a direction transverse to a direction of light propagation in said optical waveguide path so that said further electrical isolation region provides another electric path between each of said further current blocking regions;
   an electrode on a top surface of said further electrical isolation region; and
   a bias applied to said electrode to divert the parasitic current flow formed between said modulator and photodetector through said another electrical path to said applied bias so that the undesired modulated variations affecting said further applied bias current are substantially eliminated.

6. The photonic integrated circuit (PIC) of claim 5 wherein said further spaced current blocking regions are a pair of spatially disposed trenches or ion implanted regions or high resistance implanted regions.

7. The photonic integrated circuit (PIC) of claim 5 wherein said photodetector is a PIN photodiode or an avalanche photodiode.

8. The photonic integrated circuit (PIC) of claim 1 wherein said electro-optic modulator is an electro-absorption modulator or a Mach-Zehnder modulator.

9. The photonic integrated circuit (PIC) of claim 1 wherein the semiconductor laser is a DBR laser or a DFB laser.

10. The photonic integrated circuit (PIC) of claim 1 wherein said spaced current blocking regions are spaced trenches formed into said circuit and exposed to ambient environment.

11. The photonic integrated circuit (PIC) of claim 10 wherein said spaced trenches are filled with a dielectric material.

12. The photonic integrated circuit (PIC) of claim 11 wherein said dielectric material is BCB or polyimide.

13. The photonic in grated circuit (PIC) of claim 10 wherein said trenches are formed at an angle relative to the direction of light propagation in said optical waveguide path but not including an angle perpendicular to said direction.

14. The photonic integrated circuit (PIC) of claim 13 wherein said angle is about 7°.

15. The photonic integrated circuit (PIC) of claim 10 wherein the depth of said spaced trenches is sufficiently deep in said circuit to minimize said parasitical current between said pair of laser and modulator but not so deep as to substantially affect an optical mode propagating along said optical waveguide path.

16. The photonic integrated circuit (PIC) of claim 10 wherein the depth of said spaced trenches in said circuit sufficiently deep to reduce said parasitical current flow to the microampere range.

17. The photonic integrated circuit (PIC) of claim 10 wherein said spaced trenches are not so deep within said circuit to size-suppress an optical mode propagating in said optical waveguide path.

18. The photonic integrated circuit (PIC) of claim 10 wherein said spaced trenches are not so deep within said circuit to cause significant reflection of an optical mode propagating in said optical waveguide path.

19. The photonic integrated circuit (PIC) of claim 1 further comprising a region formed in said circuit below said electrical isolation region and having a higher bulk resistivity to reduce said parasitic current, $I_2$, to the microampere range.

20. The photonic in grated circuit (PIC) of claim 1 further comprising an optical amplifier that is positioned in the optical waveguide path after said modulator and having a further bias applied thereto;

electrical activation of both said modulator and optical amplifier also creating a further parasitic current between said modulator and said optical amplifier substantially aligned relative to said optical waveguide path, said second applied bias current, I3, causing modulation variations of said further parasitic current, which, in turn, causes undesirable modulated variations of said further parasitic current so that said further applied bias does not operate in a steady state condition;

a further electrical isolation region formed between said modulator and said optical amplifier, said further region formed by a air of further spaced current blocking regions extending into said circuit between said modulator and said optical amplifier in a direction transverse to a direction of light propagation in said optical waveguide path so that said electrical isolation region provides another electric path between said further spaced current blocking regions;

an electrode on a top surface of said further electrical isolation region; and a bias applied to said electrode to divert the parasitic current flow formed between said modulator and optical amplifier through said another electrical path to said applied bias so that said further electrical isolation region provides another electrical path between each of said further current blocking regions.

21. The photonic integrated circuit (PIC) of claim 20 wherein said further spaced current blocking regions are a pair of spatially disposed trenches or ion implanted regions or high resistance implanted regions.

22. The photonic integrated circuit (PIC) of claim 21 wherein said optical amplifier is a semiconductor optical amplifier (SOA).

23. The photonic integrated circuit (PIC) of claim 1 further comprising an array of semiconductor lasers and electro-optic modulators where pairs of said lasers and modulators each have a optic waveguide path including an electrical isolation region with an output from each of said modulators, and an integrated optical combiner optically coupled to receive outputs from each of said optical waveguide paths from said modulators and combines said light outputs as single output from said circuit.

24. A photonic integrated circuit (PIC) comprising:

an array of semiconductor lasers and an array of electro-optic modulators integrated on a substrate where pairs of said lasers and modulators are aligned in and serially along a respective optical waveguide path, said optical waveguide paths also formed on said substrate and are substantially parallel with a planar extent of said substrate;

an electrical isolation region formed into said semiconductor bulk between said laser and said modulator in each of said pairs; said electrical isolation region formed by a pair of spaced current blocking regions extending into said semiconductor bulk from an exposed surface of said electrical isolation region to a depth of a parasitic current, $I_2$, established in a semiconductor bulk between each of said lasers and modulators, said spaced current blocking regions establishing an electrical path therebetween and providing electrical coupling between said parasitic current, $I_2$, at one end of said electrical path and an electrode formed at the other end of said electrical path at said exposed surface of said electrical isolation region; and wherein each of said lasers each having first applied bias current, $I_1$, applied thereto as steady state condition, each of said modulators having a second applied bias current, $I_3$, different from said first applied bias current, $I_1$, and applied thereto as modulated variations in accordance with an electrical modulated signal applied to each of said modulator, the first and second applied bias currents creating said parasitic current, $I_2$, in said semiconductor bulk region in each of said pairs where said parasitic currents, $I_2$, are substantially aligned in parallel relative to said optical waveguide paths, said second applied bias currents, $I_3$, causing modulated variations of said parasitic currents, $I_2$, which, in turn, causes undesirable modulated variations of said first applied bias currents, $I_1$, through said lasers so that said lasers is no longer operating in said steady state condition; and a bias applied to each of said electrodes to divert said parasitic current, $I_2$, through said electrical path to said applied bias such that there results divided parasitic currents, $I_{2A}$ and $I_{2B}$, established, respectively, between said lasers to said applied bias and between said applied bias to said modulators so that the undesired modulated variations affecting said first applied bias current, $I_1$, relative to each of said lasers are substantially eliminated.

25. The photonic integrated circuit (PIC) of claim 24 wherein the applied bias to said electrical isolation regions is positive, negative or zero.

26. The photonic integrated circuit (PIC) of claim 25 wherein said applied bias is held at a constant value.

27. The photonic integrated circuit (PIC) of claim 24 wherein said spaced current blocking regions are a pair of spatially disposed trenches or ion implanted regions or high resistance implanted regions.

28. The photonic integrated circuit (PIC) of claim 24 wherein said semiconductor lasers are DFB lasers or DBR lasers.

29. The photonic integrated circuit (PIC) of claim 24 wherein said optical modulators are electro-absorption modulators or Mach-Zehnder modulators.

30. The photonic integrated circuit (PIC) of claim 24 further comprising an optical combiner integrated in said circuit and optically coupled to receive outputs from said modulators and combined them as a single output from said circuit.

31. The photonic integrated circuit (PIC) of claim 30 wherein said optical combiner is an arrayed waveguide grating (AWG), an echelle grating or multi-mode interference (MMI) combiner.

32. The photonic integrated circuit (PIC) of claim 24 further comprising a further electro-optic component integrated in said circuit positioned in each of said optical waveguide paths after said modulator and having a further bias applied thereto;

electrical activation of both of aid modulator and said further electro-optic component in each of said respective optical waveguide paths creating a further parasitic current between them substantially aligned relative to said optical waveguide path, said second applied bias current, $I_3$, relative to each pair of modulator and electro-optic component causing modulation variations of said further parasitic current, which, in turn, causes undesirable modulated variations of said parasitic current so that said further applied bias does not operate in a steady state condition;

a further electrical isolation region formed between said modulator and said electro-optic component in each of said optical waveguide paths, each of said further regions formed by a pair of further spaced current locking regions extending into said circuit between each of said modulators and said electro-optic components in each of said optical waveguide paths in a direction transverse to a direction of light propagation in said optical waveguide paths so that each of said electrical isolation regions provides another electrical path between each of said further spaced current blocking regions;

an electrode on a top surface of each of said further electrical isolation regions; and a bias applied to said electrode to divert the parasitic current flow formed between said modulators and electro-optic components in each of said optical waveguide paths through its respective said another electrical path to said applied bias so that said further electrical isolation regions each provide another electrical path, respectively, between said further spaced current blocking regions.

33. The photonic integrated circuit (PIC) of claim 32 wherein said further electro-optic components are photodiodes or optical amplifiers.

34. The photonic integrated circuit (PIC) of claim 33 wherein said photodetectors are PIN photodiodes or avalanche photodiodes.

35. The photonic integrated circuit (PIC) of claim 33 wherein said optical amplifiers are semiconductor optical amplifiers (SOAs).

36. The photonic integrated circuit (PIC) of claim 32 wherein said spaced current blocking regions are a pair of spatially disposed trenches or ion implanted regions or high resistance implanted regions.

37. The photonic integrated circuit (PIC) of claim 24 wherein said spaced current blocking regions are spaced trenches formed into said circuit in each of said optical waveguide paths and exposed to ambient environment.

38. The photonic integrated circuit (PIC) of claim 37 wherein said spaced trenches are filled with a dielectric material.

39. The photonic integrated circuit (PIC) of claim 38 wherein said dielectric material is BCB or polyimide.

40. The photonic integrated circuit (PIC) of claim 37 wherein said trenches are formed at an angle relative to a direction of light propagation in said optical waveguide paths but not including an angle perpendicular to said longitudinal axis.

41. The photonic integrated circuit (PIC) of claim 40 wherein said angle is about 7°.

42. The photonic integrated circuit (PIC) of claim 37 wherein the depth of said spaced trenches is sufficiently deep in said circuit to minimize said parasitical current between said pairs of lasers and modulators but not so deep as to substantially affect an optical mode propagating along said optical waveguide paths.

43. The photonic integrated circuit (PIC) of claim 37 wherein the depth of said spaced trenches in said circuit are sufficiently deep to reduce said parasitical current flows to the microampere range.

44. The photonic integrated circuit (PIC) of claim 37 wherein said spaced trenches are not so deep within said circuit to size-suppress an optical mode propagating in each of said optical waveguide paths.

45. The photonic integrated circuit (PIC) of claim 37 wherein said spaced trenches are not so deep within said circuit to cause significant reflection of an optical mode propagating in each of said optical waveguide paths.

46. The photonic integrated circuit (PIC) of claim 24 further comprising a region formed in said circuit below each of said electrical isolation regions and having a higher bulk resistivity to reduce said parasitic current, $I_2$, to the microampere range.

47. A method of electrically isolating spatially disposed semiconductor electro-optic components integrated on a substrate, which are formed in a plurality of deposited semiconductor layer where a first electro-optic component comprising a semiconductor laser is operated with a first bias current with a steady state condition and a second electro-optic component comprising an electro-optic modulator is operated with a second bias current with modulated variations in accordance with an electrical modulated signal applied to the second electro-optic component, comprising the steps of:

activating the electro-optic components with the first and second applied bias currents whereby an undesired parasitic current is established along a first electrical path between them via some of the semiconductor layers, the parasitic current also transferring modulated variations created at the second electro-optic component over to the first electro-optic component via the first electrical path so that the latter no longer operates in its steady state condition;

establishing an electrical isolation region between the first and second electro-optic components to create a second electrical path transverse in direction to the first path and formed between a bias point at surface region of the electrical isolation region and the first electrical path between the electro-optic components; and applying a bias to the bias point to divert the parasitic current from the electrical first path through the second electrical path to the bias point resulting in divided parasitic currents, respectively, between the first electro-optic component and the bias point and between the bias point and the second electro-optic component so that the undesired modulated variations along the first electrical path are substantially eliminated from affecting the first electro-optic component.

48. The method of claim 47 wherein the applied bias at the bias point is a positive bias.

49. The method of claim 47 wherein the applied bias at the bias point is a negative bias.

50. The method of claim 47 wherein the bias at the bias point is at ground reference.

51. The method of claim 47 comprising the further step of forming the electrical isolation region by providing a pair of spaced current blocking regions forming the second electrical path therebetween.

52. The method of claim 51 wherein the spaced blocking regions are a pair of spaced trenches or ion implanted regions or high resistance implanted regions.

53. The method of claim 51 further comprising the steps of:

forming a pair of spaced trenches at the electrical isolation region forming the second electrical path therebetween;

determining the depth of the spaced isolation trenches to be sufficiently deep into the circuit to minimize the parasitical current flow in the first electrical path between the electro-optic components; and limiting the depth of the isolation trenches to be not so deep into the circuit as to substantially affect the optical properties of a optical mode propagating along the optical waveguide path.

54. The method of claim 47 wherein the first electro-optic component is a photodetector or a semiconductor optical amplifier in lieu of a semiconductor laser.

55. The method of claim 47 wherein said semiconductor laser is a DFB laser or a DBR laser.

56. The method of claim 47 wherein the electro-optic modulator is an electro-absorption modulator or Mach-Zehnder modulator.

* * * * *